United States Patent [19]

McEachern et al.

[11] Patent Number: 5,184,066
[45] Date of Patent: Feb. 2, 1993

[54] METHOD AND APPARATUS FOR DISABLING ALL OPERATIONS OF AN ELECTRONIC INSTRUMENT EXCEPT FOR AN AUTOMATIC TEST PROCEDURE

[75] Inventors: Alexander McEachern, Oakland; Jamie Nicholson, Foster City; Craig S. Waterman, San Francisco, all of Calif.

[73] Assignee: Basic Measuring Instruments, Foster City, Calif.

[21] Appl. No.: 690,507

[22] Filed: Apr. 24, 1991

[51] Int. Cl.$^5$ .................... G01R 31/02; G06F 11/00
[52] U.S. Cl. ......................... 324/158 R; 324/73.1; 371/22.6
[58] Field of Search .......... 324/158 R, 73.1; 371/15.1, 16.1, 24, 29.1, 22.6, 21.1

[56] References Cited

U.S. PATENT DOCUMENTS

| | | | |
|---|---|---|---|
| 4,245,309 | 1/1981 | Kiefer | 340/309.4 |
| 4,275,464 | 6/1981 | Schmidt | 371/24 |
| 4,477,901 | 10/1984 | Braband et al. | 371/29.1 |
| 4,628,443 | 12/1986 | Rickard et al. | 371/22.6 |
| 4,730,156 | 3/1988 | Matsuda | 324/158 R |

Primary Examiner—Vinh Nguyen

[57] ABSTRACT

A locking apparatus is coupled to and incorporated within an electronic instrument to ensure that the instrument operates within a predetermined set of performance parameters. The instrument's operating characteristics will be tested and measured by an external, automatic test system as is typical in the manufacture of many electronic instruments. The locking device will prevent the ordinary operation of the instrument until the instrument has successfully passed the tests administered by the automatic test system. Upon successful completion of the tests, the test system will communicate a signal to the locking device. Upon receipt of the control signal, the locking device will "unlock" the instrument allowing normal operation. In order to ensure that routine calibration takes place, the locking device can be instructed to periodically disable normal operation of the instrument until another performance test is administered by an automatic test system.

7 Claims, 3 Drawing Sheets

METHOD AND APPARATUS FOR DISABLING ALL OPERATIONS OF AN ELECTRONIC INSTRUMENT EXCEPT FOR AN AUTOMATIC TEST PROCEDURE

FIELD OF THE INVENTION

This invention relates to a method and apparatus for controlling the manufacturing and operating quality of an electronic instrument. More particularly, this invention relates to an automatic electronic locking mechanism which disables the instrument from operating until after the instrument has successfully passed an automated electronic test procedure.

BACKGROUND OF THE INVENTION

An automatic test system which calibrates and verifies the desired operation of a completed electronic instrument is commonly used in the electronic instrument field. Ordinarily, the test system is coupled to the instrument and measures the instrument against each mode of operation and each parameter in the instrument specification. In this way, the quality of each operating mode of the device is assured. In many cases, a pass/fail report may be automatically generated and include a printout indicating the values of the various parameters measured.

Electronic instruments are commercially available for performing a wide variety of operations. For example, instruments can be used to measure voltage, current, power, frequency, wave fault detection, test other instruments or devices, generate signals or waveforms. Unfortunately, it is possible that an instrument may fail to perform its intended function or it may perform each of its intended functions as designed but fail to do so accurately.

In the case of a voltage measuring instrument, the accuracy of the measurement is typically given in the product specification or data sheet. For example, a voltage meter might be required to measure a voltage in the range of 0 to 50 volts and provide a reading of that measurement within ±0.1 V. It is possible for a system to pass all of the automated tests except that the degree of accuracy of measurement is ±0.11 V rather than the specified ±0.1 V. Unfortunately, it is possible for a Quality Engineer, Product Engineer, or a Product Manager to arbitrarily decide to ship such a product in order to meet, for example, a production quota, keep production costs low or the like.

As manufacturing processes are dispersed to additional production facilities throughout the world, control over quality becomes even more difficult. Even if the home factory provides a satellite manufacturing facility with automatic test equipment in order to ensure the quality of the finished product, it is still possible for human intervention to ship product of substandard performance.

By allowing human intervention, it is possible that substandard instruments which perform the intended functions can be shipped to customers. While these instruments fail to meet published specifications because they perform their intended functions, many customers will be unable to detect the deficiency. Such a practice can allow inadequate instruments into the field and damage a manufacturing firm's reputation.

SUMMARY OF THE INVENTION

A locking apparatus is coupled to and incorporated within an electronic instrument to ensure that the instrument operates within a predetermined set of performance parameters. The instrument's operating characteristics will be tested and measured by an external, automatic test system as is typical in the manufacture of many electronic instruments, appliances and devices. The locking device will prevent the ordinary operation of the instrument until the instrument has successfully passed the tests administered by the automatic test system. Upon successful completion of the tests, the test system will communicate a control signal to the locking device. Upon receipt of the control signal, the locking device will "unlock" the instrument allowing normal operation. The operating characteristics of some instruments may change as time passes. In order to ensure that a routine calibration of such equipment takes place, the locking device can be instructed to periodically disable normal operation of the instrument until another performance test is administered by an automatic test system.

DETAILED DESCRIPTION OF THE PREFERRED EMBODIMENT

Figure 1:
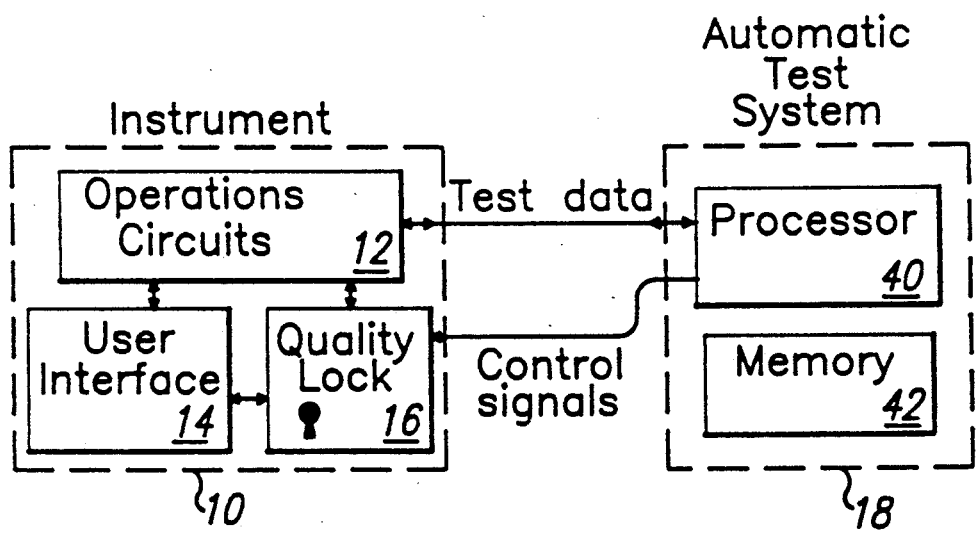
FIG. 1 is a block diagram of an instrument and test equipment according to the preferred embodiment of the present invention.

An instrument 10 typically includes the operations circuit 12 for performing the functions intended by the instrument and a user interface 14 coupled to the operations circuit 12, as shown in FIG. 1. The user interface 14 can include control switches, displays, printer interfaces and the like In the preferred embodiment, the instrument 10 also includes a quality lock device 16.

After the instrument 10 has been fully assembled, the quality lock device 16 prevents normal operation of the instrument. The quality lock device 16 is coupled to disable either the operations circuit 12, the interface circuit 14 or both.

As part of the manufacturing process, after assembly, the instrument 10 is coupled to an automatic test system 18 which has been designed to communicate with and test the performance parameters of the instrument 10 as well as to instruct the quality lock device 16. Based upon a control signal from the test system 18, the quality lock device 16 enables the operations circuit 12 to operate and to communicate solely with the test system 18 for the exclusive purpose of being examined. If the instrument 10 fails the test, the locking device 16 will not enable the instrument to operate normally. In an instrument 10 that failed the test, the locking device 16 will only enable the operation circuit 12 to interface with the test system 18 for further tests or automatic diagnoses. If, on the other hand, the instrument 10 passes the test, the quality lock device 16 fully enables the operation of the instrument. Thereafter, the instrument can be used for its intended purpose.

It should be apparent that the test system 18 must be specifically designed or programmed to interface with an instrument containing a quality lock device 16. Preferably, the test system 18 operates under control of a processor 40. The processor executes a program of a sequence of instructions stored in a memory 42. The program includes the instructions necessary for the processor 40 to pass the appropriate control signal to the quality lock device 16.

The test system 18, as all automatic testers, can include timers, comparators, level detectors and the like. The test system 18 also includes means for communicating with the quality lock device 16 and is coupled to provide control signals to the quality lock device 16.

Two types of control signals are passed from the test system 18 to the quality lock device 16. The first control signal instructs the quality lock device 16 that the test system 18 is coupled to test the performance of the instrument 10. Preferably, any time that the test system 18 is coupled to the instrument 10, the quality lock 16 will be instructed to allow the instrument 10 to operate for testing purposes. The second control signal instructs the quality lock device 16 that the instrument 10 has passed the test. Once this second type of control signal is passed to the quality lock 16, the instrument 10 will operate normally.

For certain types of electronic instruments 10, it may be desirable that periodic calibration tests are performed. This is because the operating characteristics may change or drift as the instrument 10 ages through operation. In such circumstances, the quality lock device 16 will periodically disable the normal operation of the test instrument. Once this occurs, the instrument cannot be operated for its intended purpose until the instrument is coupled to the test system 18 again and re-passes the test. In other words, the system periodically reverts to the same condition it was in immediately after the instrument 10 was fully assembled, i.e. it will not operate again until it has been tested and receives the proper control signal from the test system 18.

Figure 2:
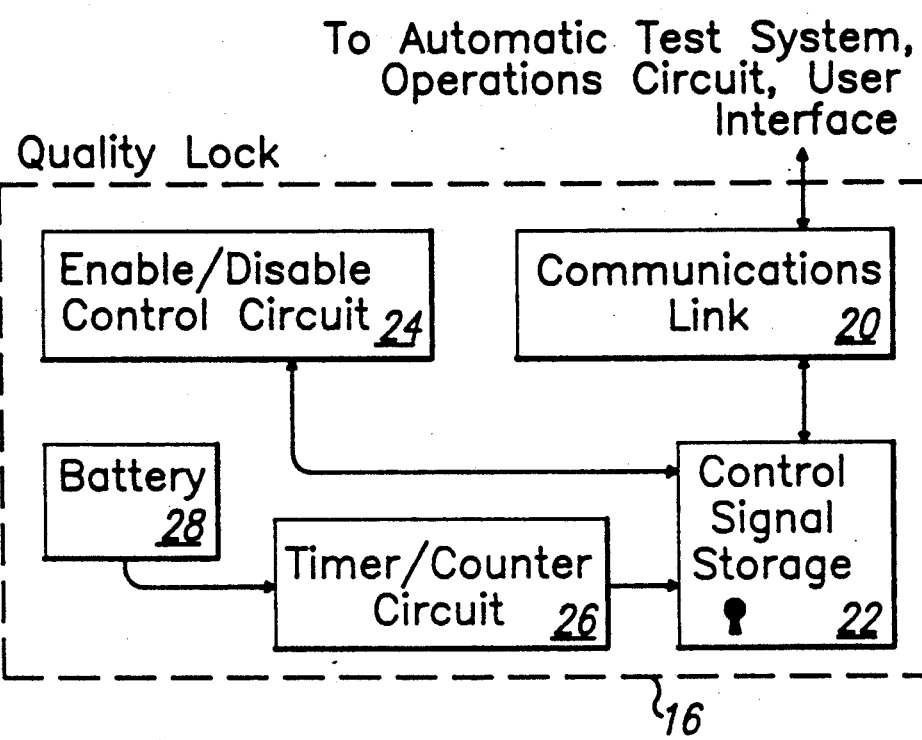
FIG. 2 is a more detailed block diagram of the quality lock according to the present invention.

FIG. 2 shows a more detailed block diagram of the quality lock device 16. The lock includes a communications interface link 20 coupled to receive instructions from the test system 18, the operations circuit 12, and the user interface 14. The interface link 20 may be a single unit or it may be divided into separate links, one for each system to be communicated with. The communications between the quality lock 16 and the test system 18 may be through the operations electronics 12 or may be direct, as shown in FIG. 1.

A control signal storage 22 is included to hold the instruction from the test instrument 18 indicating that the instrument 10 has passed the test. The storage is preferably non-volatile such as an EPROM or EEPROM register. An enable/disable control circuit 24 is coupled to the operations circuit 12 and the interface circuit 14 through the interface link 20 and transmits an appropriate control signal based upon the condition of the storage circuit 22.

A timer/counter circuit 26 measures the period of time that the instrument 10 has operated. Upon reaching a predetermined period, the timer/counter circuit 26 is coupled to reset the storage circuit 22. The instrument is thus disabled and requires a recalibration of the system before being enabled for further operations.

The timer/counter circuit 26 must properly track the period of operation of the instrument 10 even if the power is removed from the instrument 10. To do this, the timer/counter circuit 26 may include a battery 28 to maintain the measured time while power is removed. In the alternative, the timer may store its count in the non-volatile memory circuit 22 upon sensing a power down condition. Upon a power up condition, the count will be replaced into the timer/counter circuit 26. This is particularly useful where recalibration is required after a predetermined number of operation hours has passed rather than passage of calendar time.

The quality lock device 16 may also be conditioned to control a display in the interface circuit 14. For example, if the instrument is to be recalibrated once a year, a display can be activated indicating that one month is left until recalibration is required. In this way, the user can recalibrate the system prior to the system shutting down and thereby avoid unnecessary or inconvenient down time of the instrument.

Figure 3:
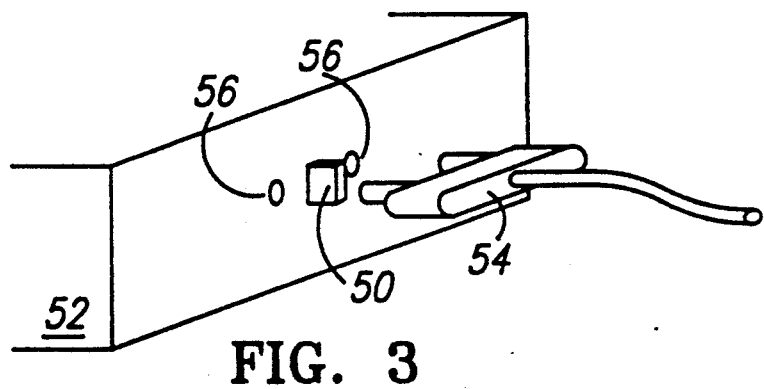
FIG. 3 is a perspective view of a mechanical quality lock according to the present invention.
Figure 4:
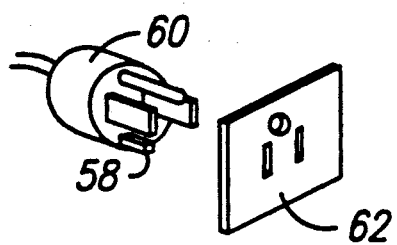
FIG. 4 is a perspective view of an alternate embodiment of a mechanical quality lock according to the present invention.
Figure 5:
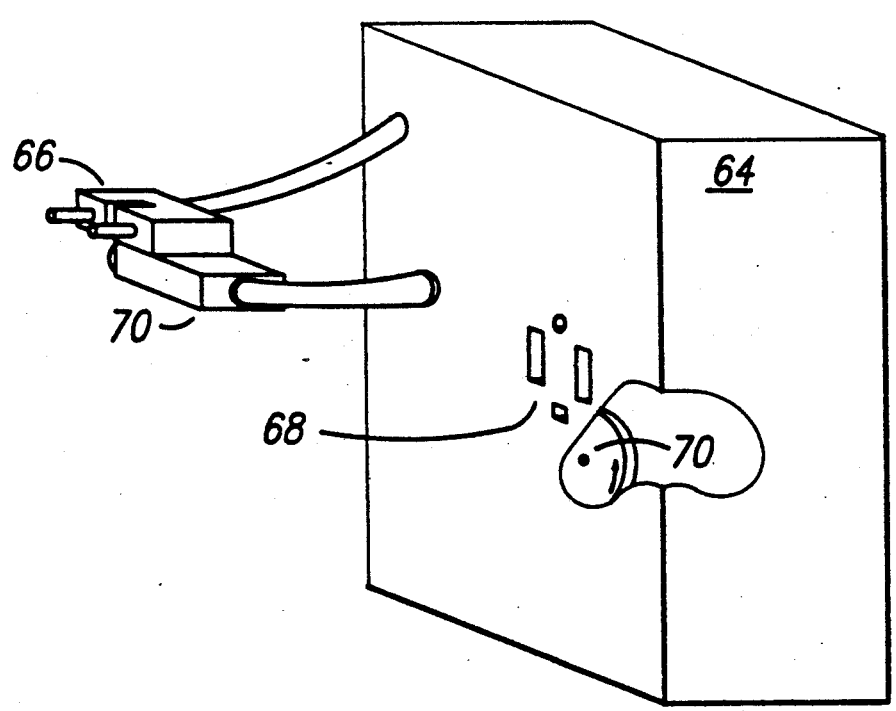
FIG. 5 is a perspective and partial cut away view of a test system according to the present invention.

Another alternative of the present invention is a mechanical quality lock device 50. The mechanical lock 50 prevents the operation of the instrument 52 by preventing the instrument from coupling to ordinary connectors, such as probes or power lines, by being physically interposed between the connectors. The mechanical lock 50 prevents the probe 54 from mating with the socket 56 as shown in FIG. 3. Similarly, the mechanical lock 58 prevents the instrument power connector 60 from being inserted into a power socket 62, as shown in FIG. 5.

The test system 64 includes specially designed connectors 66 and 68 which are designed to accept the probe 54 and the connector 60, respectively. The tester preferably also includes automatic means 70 and 72 to remove the mechanical locks 50 and 58, respectively, by shearing or grinding.

What is claimed is:

1. A quality lock apparatus, coupled to an electronic instrument that is tested by an automatic test system, the apparatus for selectively enabling operation of the instrument, the apparatus comprising:
    a) means for coupling the instrument and the apparatus to the test system;
    b) means for disabling all operations of the instrument except for an ability to respond to an automatic test procedure performed by the test system, wherein the means for disabling is coupled to the instrument through the means for coupling;
    c) means for receiving and storing a control signal from the test system indicating that the instrument passed the test procedure, wherein the means for receiving and storing a control signal is coupled to the test system through the means for coupling; and
    d) means for enabling operation of the instrument only after receiving the control signal, wherein the means for enabling is coupled to the instrument through the means for coupling and wherein the means for enabling is coupled to the means for receiving and storing a control signal.

2. The apparatus according to claim 1 further comprising timer means for periodically disabling the instrument until an additional test procedure is performed.

3. An electronic instrument which is tested by an automatic test system that performs a quality test of a plurality of operating characteristics of the instrument, the instrument including a quality lock device, the quality lock comprising:

a) means for coupling the instrument to the automatic test system including an instrument-to-test-system communication link wherein the instrument-to-test-system communication link is never disabled even though the instrument may be decoupled from the test system;

b) means for disabling operation of the instrument exclusive of the instrument to test system communication link until the instrument has passed the quality test, wherein the means for disabling operation is coupled to the instrument through the means for coupling;

c) means for disabling electronic communication between the instrument and any external circuit exclusive of the instrument to test system communication link until the instrument has passed the quality test, wherein the means for disabling electronic communication is coupled to the instrument through the means for coupling;

d) means for enabling operation of the instrument after the instrument has passed the quality test, wherein the means for enabling operation is coupled to the instrument through the means for coupling;

e) means for enabling electronic communication between the instrument and any external circuit after the instrument has passed the quality test, wherein the means for enabling electronic communication is coupled to the instrument through the means for coupling;

f) means for periodically disabling operation of the instrument exclusive of the instrument to test system communication link until the instrument has repassed the quality test, wherein the means for periodically disabling is coupled to the means for disabling; and g) means for periodically disabling electronic communication between the instrument and any external circuit exclusive of the instrument to test system communication link until the instrument has repassed the quality test, wherein the means for periodically disabling electronic communication is coupled to the means for disabling electronic communication.

4. A method for ensuring compliance of an electronic instrument to a plurality of predetermined operating characteristics comprising the steps of:

a) disabling operati,on of the instrument exclusive of an instrument-to-test-system communication link until the instrument has passed a quality test;

b) disabling electronic communication between the instrument and any external circuit exclusive of the instrument-to-test-system communication link until the instrument has passed the quality test;

c) performing the quality test;

d) enabling operation of the instrument after the instrument has passed the quality test;

e) enabling electronic communication between the instrument and any external circuit after the instrument has passed the quality test;

f) periodically disabling operation of the instrument exclusive of the instrument-to-test-system communication link until the instrument has repassed the quality test; and g) periodically disabling electronic communication between the instrument and any external circuit exclusive of the instrument-to-test-system communication link until the instrument has repassed the quality test.

5. A method for selectively enabling operation of an electronic instrument comprising:

a) automatically disabling all operations of the instrument except for an automatic test procedure performed by a test system;

b) automatically coupling the test system for transmitting a control signal from the test system to a quality lock device for indicating that the instrument passed the test procedure;

c) storing the control signal in the quality lock device; and d) enabling operation of the instrument only after receiving the control signal.

6. The method according to claim 5 further comprising means for periodically disabling the instrument until an additional test procedure is performed.

7. The apparatus according to claim 1 wherein the quality lock device is integral to the instrument.

* * * * *

UNITED STATES PATENT AND TRADEMARK OFFICE
CERTIFICATE OF CORRECTION

PATENT NO. : 5,184,066
DATED : 02/02/93
INVENTOR(S) : ALEXANDER MCEACHERN ET AL.

It is certified that error appears in the above-identified patent and that said Letters Patent is hereby corrected as shown below:

On the title page, item [54] and column 1, line 5, insert --UNTIL THE INSTRUMENT PASSES THE TEST PROCEDURE-- after the word "PROCEDURE".

In Column 2, Line 11 delete "t he" and replace with --the--.

In Column 2, Line 66 delete "I8" and replace with --18--.

In Column 4, Line 4 delete "timer/oounter" and replace with --timer/counter--.

In Column 4, Line 35 delete "inoludes" and replace with --includes--.

In Column 6, Line 4 delete "operati,on" and replace with --operation--.

In Column 6, Line 36 delete "devioe" and replace with --device--.

UNITED STATES PATENT AND TRADEMARK OFFICE
CERTIFICATE OF CORRECTION

PATENT NO. : 5,184,066
DATED : 02/02/93
INVENTOR(S) : ALEXANDER MCEACHERN ET AL.

It is certified that error appears in the above-identified patent and that said Letters Patent is hereby corrected as shown below:

In Column 6, Line 40, delete "means for".

Signed and Sealed this

Second Day of November, 1993

Attest:

BRUCE LEHMAN

Attesting Officer

Commissioner of Patents and Trademarks